(12) United States Patent
Hwang et al.

(10) Patent No.: US 8,129,716 B2
(45) Date of Patent: Mar. 6, 2012

(54) OTFT AND MIM CAPACITOR USING SILK PROTEIN AS DIELECTRIC MATERIAL AND METHODS FOR MANUFACTURING THE SAME

(75) Inventors: Jenn-Chang Hwang, Hsinchu (TW); Chung Hwa Wang, Hsinchu (TW); Chao Ying Hsieh, Hsinchu (TW)

(73) Assignee: National Tsing Hua University, Hsinchu (TW)

( * ) Notice: Subject to any disclaimer, the term of this patent is extended or adjusted under 35 U.S.C. 154(b) by 161 days.

(21) Appl. No.: 12/761,008

(22) Filed: Apr. 15, 2010

(65) Prior Publication Data

US 2011/0227046 A1  Sep. 22, 2011

(51) Int. Cl.
*H01L 21/00* (2006.01)
*H01L 51/30* (2006.01)
(52) U.S. Cl. ............... 257/40; 438/99; 257/E51.024
(58) Field of Classification Search .............. 257/40, 257/E51.024; 438/99
See application file for complete search history.

(56) References Cited

U.S. PATENT DOCUMENTS 6,847,048 B2 * 1/2005 Yan et al. .................. 257/40
2011/0253984 A1 * 10/2011 Hwang et al. .............. 257/40

OTHER PUBLICATIONS

Hagen Klauk, et al.; High-mobility polymer gate dielectric pentacene thin film transistors; *Journal of Applied Physics*; Nov. 1, 2002; p. 5259-p. 5263; vol. 92, No. 9.
Hsiao-Wen Zan, et al.; Low-voltage organic thin film transistors with hydrophobic aluminum nitride film as gate insulator; *Organic Electronics*; Dec. 22, 2006; p. 450-p. 454.

* cited by examiner

Primary Examiner — Evan Pert
(74) *Attorney, Agent, or Firm* — Muncy, Geissler, Olds & Lowe, PLLC

(57) ABSTRACT

An organic thin film transistor (OTFT) and a metal-insulator-metal (MIM) capacitor using silk protein as a dielectric material, and methods for manufacturing the same are disclosed. The OTFT of the present invention comprises: a substrate; a gate electrode disposed on the substrate; a gate insulating layer containing silk protein, which is disposed on the substrate and covers the gate electrode; an organic semiconductor layer; and a source electrode and a drain electrode, wherein the organic semiconductor layer, the source electrode and the drain electrode are disposed over the gate insulating layer.

30 Claims, 9 Drawing Sheets

OTFT AND MIM CAPACITOR USING SILK PROTEIN AS DIELECTRIC MATERIAL AND METHODS FOR MANUFACTURING THE SAME

BACKGROUND OF THE INVENTION

1. Field of the Invention

The present invention relates to an organic thin film transistor (OTFT) and a metal-insulator-metal (MIM) capacitor, and methods for manufacturing the same and, more particularly, to an OTFT and a MIM capacitor using silk protein as a dielectric material, and methods for manufacturing the same.

2. Description of Related Art

Thin film transistors (TFTs) are fundamental components in contemporary electronics, such as sensors, image scanners, and electronics display devices. In recent years, in order to decrease the production cost and increase the product application, organic thin film transistors (OTFTs) are rapidly developed which have the advantaged of low-cost and flexibility, can be produced in large-area.

The OTFTs can be divided into top contact OTFTs and bottom contact OTFTs. As shown in the FIG. 1, the top contact OTFT comprises: a substrate 10; a gate electrode 11 disposed on the substrate 10; a gate insulating layer 12 disposed on the substrate 11 and covering the gate electrode 11; an organic semiconductor layer 13 covering the entire surface of the organic semiconductor layer 12; and a source electrode 14 and a drain electrode 15 disposed on the organic semiconductor layer 13 respectively.

In addition, as shown in FIG. 2, the bottom contact OTFT comprise: a substrate 10; a gate electrode 11 disposed on the substrate 10; a gate insulating layer 12 disposed on the substrate 10 and covering the gate electrode 11; a source electrode 14 and a drain electrode 15 disposed on the gate insulating layer 12 respectively; and an organic semiconductor layer 13 covering the gate insulating layer 12, the source electrode 14, and the drain electrode 15.

In the conventional method for forming the gate insulating layer, the dielectric material is sputtered on the substrate and the gate electrode to from the gate insulating layer. However, the instrument for the sputtering process is very expensive and the process is complicated. In addition, the theoretical carrier mobility of the pentacene, which is the conventional material used in the organic semiconductor layer of the OTFT, is about 10 cm$^2$/V-sec, and cannot match well with the carrier mobility of the conventional dielectric material. Hence, the actual carrier mobility of the pentacene in the pentacene OTFT is far below the theoretical mobility thereof. For example, when silicon nitride is used as a material of the gate insulating layer in the pentacene OTFT, the carrier mobility of the pentacene is lower than 0.5 cm$^2$/V-sec. Even though aluminum nitride is used as the material of the gate insulating layer in the pentacene OTFT, the carrier mobility of the pentacene cannot be higher than 2 cm$^2$/V-sec. Hence, it is impossible to manufacture OTFTs with high efficiency by using the present techniques and materials.

Therefore, it is desirable to develop an OTFT and a method for manufacturing the same, in order to prepare OTFTs in a simple and cheap way, and increase the efficiency of the OTFTs.

In addition, the metal-insulator-metal (MIM) capacitors are widely applied on digital and radio frequency (RF) circuit designs. Currently, several dielectric materials with high dielectric constant are developed to increase the capacitor density of the MIM capacitors and decrease the leakage current thereof.

As shown in FIG. 2, a conventional MIM capacitor comprises: a substrate 20; a first electrode 21 disposed on the substrate 20; an insulating layer 22, disposed on the substrate 20 and covering the first electrode 21; and a second electrode 22 disposed on the insulating layer 22. Herein, the conventional dielectric material used in the insulating layer of the MIM capacitor can be TiN, TiO$_2$, SiO$_2$, and SiN. However, when the aforementioned dielectric material is used as the insulating layer of the MIM capacitor, the insulating layer is formed on the metal layer by use of the sputtering process or the vacuum deposition equipment, which may cause the production cost and the process complexity increased.

Therefore, it is desirable to develop a MIM capacitor and a method for manufacturing the same, in order to prepare MIM capacitors in a simple and cheap way and apply on various digital and RF circuits.

SUMMARY OF THE INVENTION

The object of the present invention is to provide an OTFT and a method for manufacturing the same to prepare an OTFT with high efficiency.

Another object of the present invention is to provide a MIM capacitor and a method for manufacturing the same, in order to prepare a MIM capacitor through a simple and cheap process.

To achieve the object, the OTFT of the present invention comprises: a substrate; a gate electrode disposed on the substrate; a gate insulating layer disposed on the substrate and covering the gate electrode, wherein the gate insulating layer comprises silk protein; an organic semiconductor layer; and a source electrode and a drain electrode, wherein the organic semiconductor layer, the source electrode, and the drain electrode are disposed over the gate insulating layer.

In addition, the present invention further provides a method for manufacturing the aforementioned OTFT, which comprises the following steps: (A) providing a substrate; (B) forming a gate electrode on the substrate; (C) coating the substrate having the gate electrode formed thereon with a silk solution to obtain a gate insulating layer on the substrate and the gate electrode; and (D) forming an organic semiconductor layer, a source electrode, and a drain electrode over the gate insulating layer.

Furthermore, in order to achieve the object, the MIM capacitor of the present invention comprises: a substrate; a first electrode disposed on the substrate; an insulating layer disposed on the substrate and covering the first electrode, wherein the insulating layer comprises silk protein; and a second electrode disposed on the insulating layer.

In addition, the present invention further provides a method for manufacturing the aforementioned MIM capacitor, which comprises the following steps: (A) providing a substrate; (B) forming a first electrode on the substrate; (C) coating the substrate having the first electrode formed thereon with a silk solution to obtain an insulating layer on the substrate and the first electrode; and (D) forming a second electrode on the insulating layer.

According to the OTFT and the MIM capacitor and the methods for manufacturing the same of the present invention, the substrate with a gate electrode or a first electrode formed thereon is coated with a silk solution to form a gate insulating layer or an insulating layer containing silk protein. Compared to the conventional method for forming the gate insulating layer or an insulating layer through a sputtering process or a vacuum deposition process, the method of the present invention can be performed in a solution process. Hence, the process of the present invention is quietly cheap and simple, and can be used for preparing the OTFT and the MIM capacitor with large area. Also, the silk protein is cheap and easily available. In addition, the silk protein used in the OTFT of the present invention has the carrier mobility of 6-10 $cm^2$/V-sec, so the silk protein can match well with the material of the organic semiconductor layer. Therefore, the transistor characteristics of the OTFT can be greatly improved.

According to the OTFT and the MIM capacitor of the present invention, the silk protein may be natural silk protein. Preferably, the silk protein is fibroin. In addition, according to the methods for manufacturing the OTFT and the MIM capacitor of the present invention, the silk solution may be an aqueous solution containing natural silk protein. Preferably, the silk solution is an aqueous solution containing fibroin.

According to the method for manufacturing an OTFT of the present invention, the step (C) for coating the silk solution may further comprise the following steps: (C1) providing a silk solution; (C2) coating the substrate having the gate electrode formed thereon with the silk solution; and (C3) drying the silk solution coated on the substrate and the gate electrode to obtain a gate insulating layer on the substrate and the gate electrode. Herein, the step (C2) can be performed through a spin coating process, a dip coating process, a roll coating process, or a printing process. Preferably, the step (C2) is performed through a dip coating process. Hence, the step (C2) is preferably performed by immersing the substrate having the gate electrode formed thereon into the silk solution to coat the substrate and the gate electrode with the silk solution.

In addition, according to the method for manufacturing a MIM capacitor of the present invention, the step (C) for coating the silk solution may further comprise the following steps: (C1) providing a silk solution; (C2) coating the substrate having the first electrode formed thereon with the silk solution; and (C3) drying the silk solution coated on the substrate and the first electrode to obtain an insulating layer on the substrate and the first electrode. Herein, the step (C2) can be performed through a spin coating process, a dip coating process, a roll coating process, or a printing process. Preferably, the step (C2) is performed through a dip coating process. Hence, the step (C2) is preferably performed by immersing the substrate having the first electrode formed thereon into the silk solution to coat the substrate and the first electrode with the silk solution.

Hence, according to the methods for manufacturing the OTFT and the MIM capacitor of the present invention, the silk film, which is used as a gate insulating layer or an insulating layer, can be easily formed through a dip coating process and a drying process. Herein, the drying process can be any conventional drying methods, such as an air-drying process or a baking process. In addition, the step (C) can be repeated to form the silk film with a multi-layered structure, if it is needed.

In addition, according to the OTFT and the MIM capacitor and the methods for manufacturing the same of the present invention, the substrate may be a plastic substrate, a glass substrate, a quartz substrate, or a silicon substrate. Preferably, the substrate is a flexible substrate, i.e. a plastic substrate. When the plastic substrate is used, the device prepared in the present invention has flexibility. In addition, the material of each electrodes containing the gate electrode, the source electrode, the drain electrode, the first electrode and the second electrode may be independently selected from the group consisting of Cu, Cr, Mn, Fe, Co, Ni, Zn, Pd, Ag, Pt, Au, and Al.

According to the OTFT and the method for manufacturing the same of the present invention, the material of the organic semiconductor layer may comprise pentacene. Preferably, the material of the organic semiconductor layer is pentacene.

Furthermore, according to the method for manufacturing the OTFT of the present invention, the organic semiconductor layer covers the entire surface of the gate insulating layer, and the source electrode and the drain electrode are formed on the organic semiconductor layer to obtain a top contact organic thin film transistor, in the step (D).

In addition, according to the method for manufacturing the OTFT of the present invention, the source electrode and the drain electrode are formed on the gate insulating layer, and the organic semiconductor layer covers the source electrode, the drain electrode, and the gate insulating layer to obtain a bottom contact organic thin film transistor, in the step (D).

DETAILED DESCRIPTION OF THE PREFERRED EMBODIMENT

The present invention has been described in an illustrative manner, and it is to be understood that the terminology used is intended to be in the nature of description rather than of limitation. Many modifications and variations of the present invention are possible in light of the above teachings. Therefore, it is to be understood that within the scope of the appended claims, the invention may be practiced otherwise than as specifically described.

Embodiment 1

Top Contact OTFT

[Preparation of a Silk Solution]

First, 10 wt % of an aqueous solution of $Na_2CO_3$ was provided and heated. When the solution was boiling, natural silk was added thereto, and the solution was kept boiling to remove sericin. Then, the silk without sericin was washed by deionized water to remove the alkali salt adhered on the silk. After a drying process, refined silk, i.e. fibroin, was obtained.

Next, the refined silk was added into 85 wt % of phosphoric acid ($H_3PO_4$) solution (20 ml), and the resulted solution was stirred until the refined silk was dissolved. Then, the phosphoric acid solution containing the refined silk was put into a membrane (Spectra/Por 3 membrane, molecular weight cut-off=14000). The dialysis process was performed for 3 days to remove the phosphoric acid. Finally, a filter paper is used to filter out impurities, and an aqueous solution of fibroin was obtained.

[Preparation of a Top Contact OTFT]

Figure 1A:
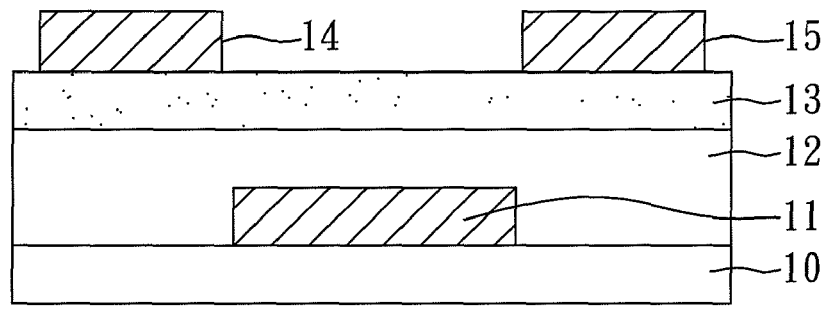
FIG. 1A is a perspective view of a conventional top contact OTFT.
Figure 1B:
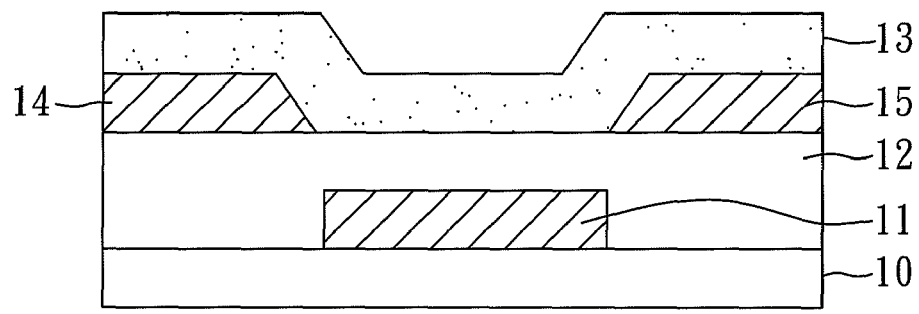
FIG. 1B is a perspective view of a conventional bottom contact OTFT.
Figure 2:
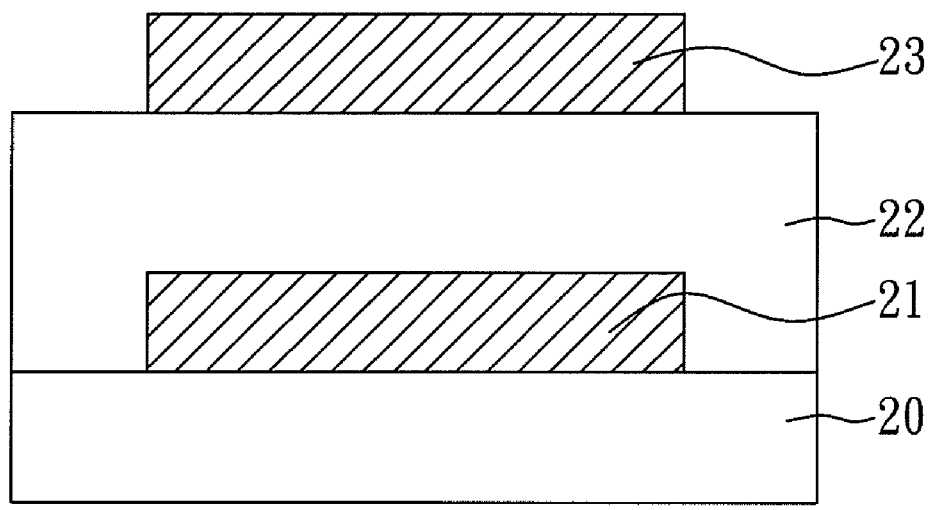
FIG. 2 is a perspective view of a conventional MIM capacitor.
Figure 3A:
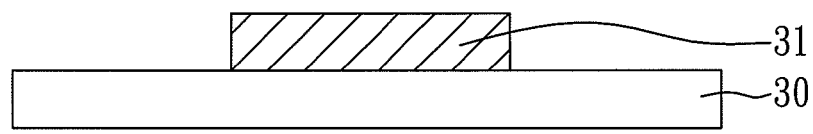
FIGS. 3A to 3D are cross-sectional views illustrating the process for manufacturing a top contact OTFT in Embodiment 1 of the present invention.

As shown in FIG. 3A, a substrate 30 was provided, and the substrate 30 was cleaned by deionized water through a sonication process. In the present embodiment, the substrate 30 was a plastic substrate made of PET.

Next, the substrate 30 was placed inside a vacuum chamber (not shown in the figure), and a metal was evaporated on the substrate 30 by using a mask (not shown in the figure) to form a pattered metal layer, which was used as a gate electrode 31, as shown in FIG. 3A. In the present embodiment, the metal used in the gate electrode 31 was Au, and the thickness of the gate electrode 31 was about 80 nm. In addition, the condition of the evaporation process for forming the gate electrode 31 was listed below.

Pressure: $5 \times 10^{-6}$ torr
Evaporation rate: 1 Å/s

Figure 3B:
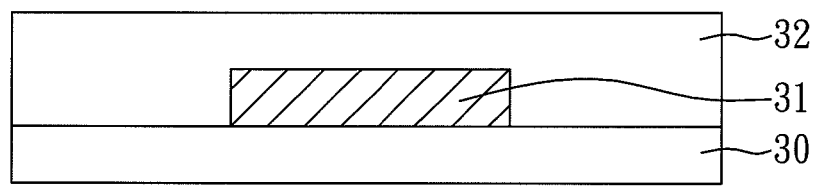

Then, the substrate 30 having the gate electrode 31 formed thereon was dipped into the silk solution for 15 mins to coat the substrate 30 having the gate electrode 31 with the silk solution. After the coating process, the substrate 30 coated with the silk solution was dried at 60° C. to form a silk film, and the silk film was used as a gate insulating layer 32, as shown in FIG. 3B. In the present embodiment, the gate insulating layer 32 formed by the silk film has a thickness of 400 nm. In addition, the coating process and the drying process can be performed several times to form a silk film with multi-layered structure.

Figure 3C:
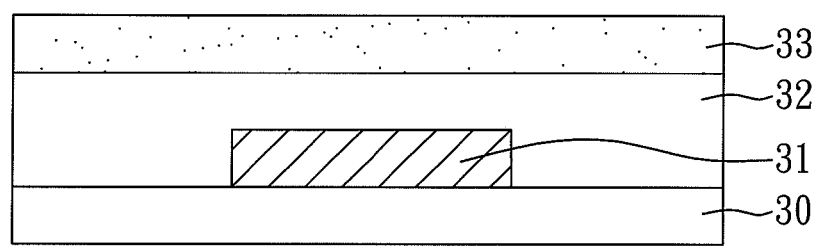

As shown in FIG. 3C, through a heat evaporation process, pentacene was deposited on the gate insulating layer 32 at room temperature by use of a shadow metal mask to form an organic semiconductor layer 33. In the present embodiment, the thickness of the organic semiconductor layer 33 is about 70 nm. In addition, the conditions of the heat evaporation process for forming the organic semiconductor layer 33 were listed below.

Pressure: $2 \times 10^{-6}$ torr
Evaporation rate: 0.3 Å/s

Finally, the same evaporation process for forming the gate electrode was performed to form a patterned metal layer, which was used as a source electrode 34 and a drain electrode 35, on the organic semiconductor layer 33 by using another mask (not shown in the figure). In the present embodiment, the material of the source electrode 34 and the drain electrode 35 was Au, and the thickness of source electrode 34 and the drain electrode 35 was about 80 nm.

Figure 3D:
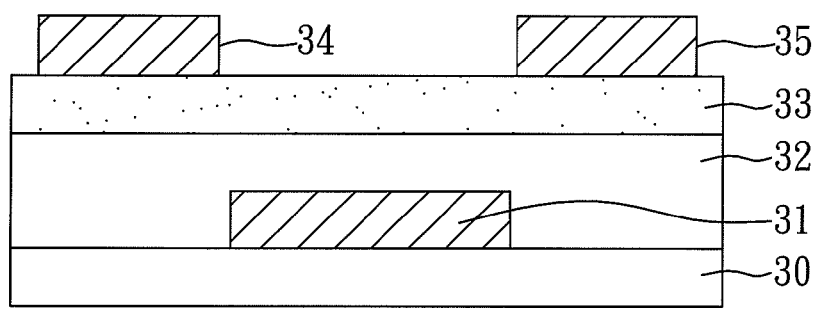

As shown in FIG. 3D, after the aforementioned process, a top contact OTFT of the present embodiment was obtained, which comprises: a substrate 30; a gate electrode 31 disposed on the substrate 30; a gate insulating layer 32 disposed on the substrate 30 and covering the gate electrode 31, wherein the gate insulating layer 32 comprises silk fibroin; an organic semiconductor layer 33 covering the entire surface of the gate insulating layer 32; and a source electrode and a drain electrode, respectively disposed on the organic semiconductor layer 33.

[Evaluation the Characteristics of the OTFT]

Figure 4:
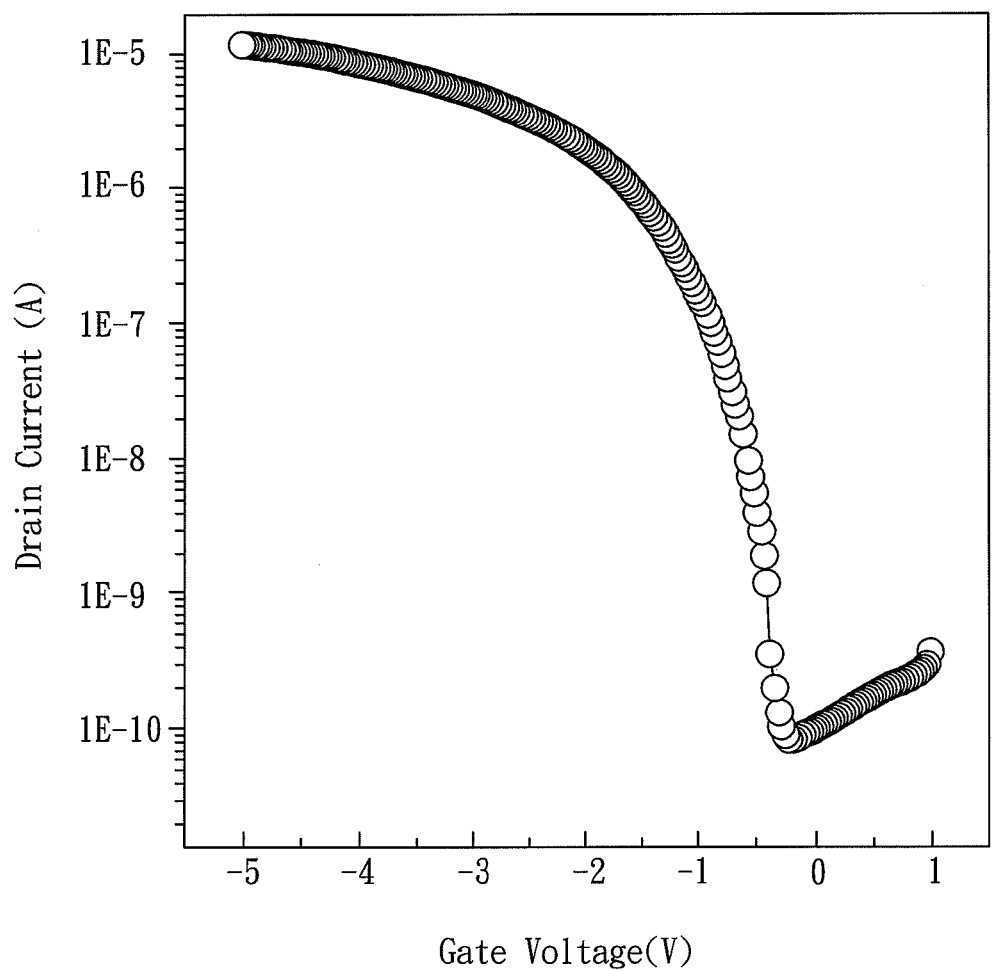
FIG. 4 is a curve showing the transfer characteristic of the OTFT of Embodiment 1 of the present invention.
Figure 5:
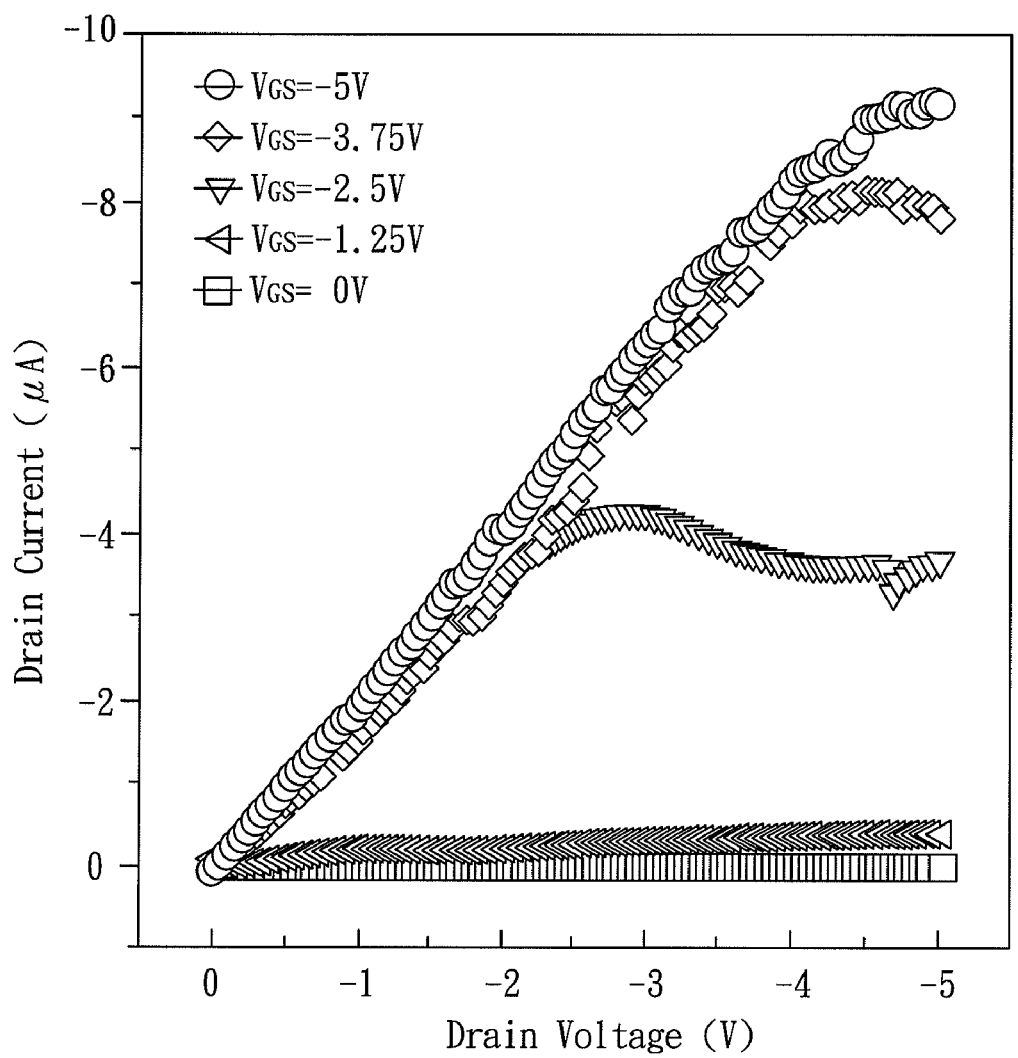
FIG. 5 is a curve showing the output characteristic of the OTFT of Embodiment 1 of the present invention.

A current-voltage test was performed on the top contact OTFT of the present embodiment. The result of the transfer characteristic of the OTFT is shown in FIG. 4, and the result of the output characteristic under different gate voltage ($V_G$) is shown in FIG. 5. The current on-to-off ratio ($I_{ON/OFF}$), the subthreshold swing (S.S), the carrier mobility and the threshold voltage ($V_{TH}$) are listed in the following Table 1.

TABLE 1

|  | Results |
| --- | --- |
| Channel width | 600 μm |
| Channel length | 50 μm |
| Thickness of the gate insulating layer | 400 nm |
| $I_{ON/OFF}$ | $1.4 \times 10^5$ |
| S.S | 102 mV/decade |
| Carrier mobility | 10.8 cm$^2$/V-sec |
| $V_{TH}$ | −0.58 V |

According to the results shown in FIG. 4, FIG. 5 and Table 1, the carrier mobility of the silk protein is about 10 cm$^2$/V-sec, so the carrier mobility of the gate insulating layer made of the silk protein matches well with that of the organic semiconductor layer made of pentacene (the potential fundamental upper limit of about 10 cm$^2$/V-sec, compared to the conventional pentacene OTFT with a gate insulating layer made from silicon nitride or aluminum nitride. Hence, the transistor efficiency of the pentacene OTFT of the present embodiment, which has the gate insulating layer made from the silk protein, can be improved greatly.

Embodiment 2

Bottom Contact OTFT

Figure 6A:
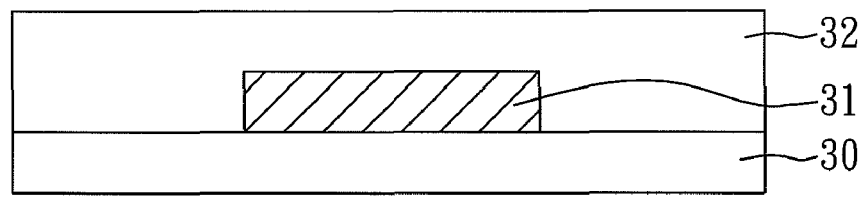
FIGS. 6A to 6C are cross-sectional views illustrating the process for manufacturing a bottom contact OTFT in Embodiment 2 of the present invention.

As shown in FIG. 6A, a substrate 30 was provided, and a gate electrode 31 and a gate insulating layer 32 was formed on the substrate 30 sequentially. In the present embodiment, the preparing methods and the materials of the substrate 30, the gate electrode 31, and the gate insulating layer 32 are the same as those illustrated in Embodiment 1. In addition, in the present embodiment, the thickness of the gate electrode 31 was about 100 nm, and the thickness of the gate insulating layer was about 500 nm.

Figure 6B:
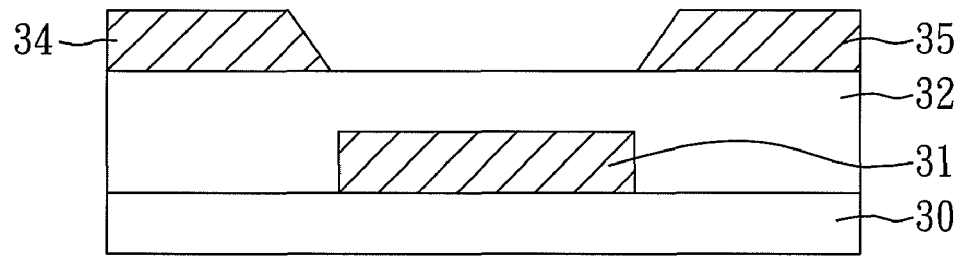

Next, the evaporation process was performed on the gate insulating layer 32 to form a patterned metal layer through the same evaporation process for forming the gate electrode described in Embodiment 1, wherein the patterned metal layer was used as a source electrode 34 and a drain electrode 35, as shown in FIG. 6B. In the present embodiment, the material of the source electrode 34 and the drain electrode 35 was Au, and the thickness of the source electrode 34 and the drain electrode 35 was about 100 nm.

Figure 6C:
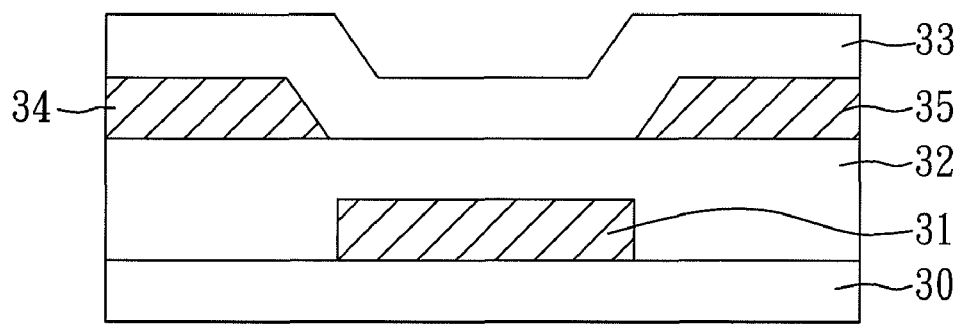

Finally, an organic semiconductor layer 33 was formed on the gate insulating layer 32, the source electrode 34, and the drain electrode 35 through the same process for forming the organic semiconductor layer described in Embodiment 1, as shown in FIG. 6C. In the present embodiment, the material of the organic semiconductor layer 33 is pentacene, and the thickness of the organic semiconductor layer 33 is about 100 nm.

As shown in FIG. 6C, after the aforementioned process, a bottom contact OTFT of the present embodiment was obtained, which comprises: a substrate 30; a gate electrode 31 disposed on the substrate 30; a gate insulating layer 32 disposed on the substrate 30 and covering the gate electrode 31, wherein the gate insulating layer 32 comprises silk fibroin; a source electrode 34 and a drain electrode 35 respectively located on the gate insulating layer 32; and an organic semiconductor layer 33 covering the gate insulating layer 32, the source electrode 34, and the drain electrode 35.

Embodiment 3

MIM Capacitor

Figure 7A:
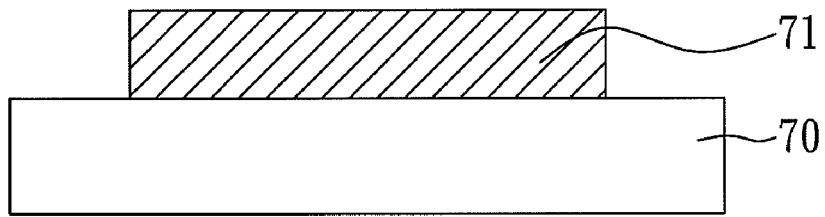
FIGS. 7A to 7C are cross-sectional views illustrating the process for manufacturing a MIM capacitor in Embodiment 3 of the present invention.

As shown in FIG. 7A, a substrate 70 was provided, and a first electrode 71 was formed on the substrate 70. In the present embodiment, the preparing method and the material of the first electrode 71 are the same as the process for forming the gate electrode illustrated in Embodiment 1. In the present embodiment, the substrate 70 was a plastic substrate, the material of the first electrode 71 was Au, and the thickness of the first electrode 71 was about 80 nm.

Figure 7B:
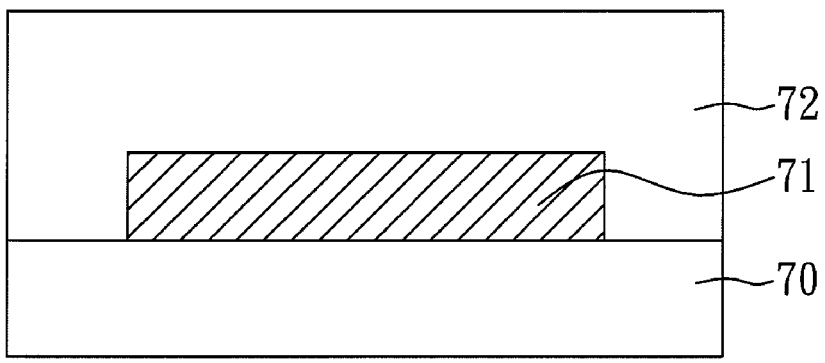

Next, the substrate 70 having the first electrode 71 formed thereon was dipped into the silk solution prepared in Embodiment 1 for 15 mins to coat the substrate 70 having the first electrode 71 with the silk solution. After the coating process, the substrate 70 coated with the silk solution was dried at 60° C. to form a silk film, and the silk film was used as an insulating layer 72, as shown in FIG. 7B.

Figure 7C:
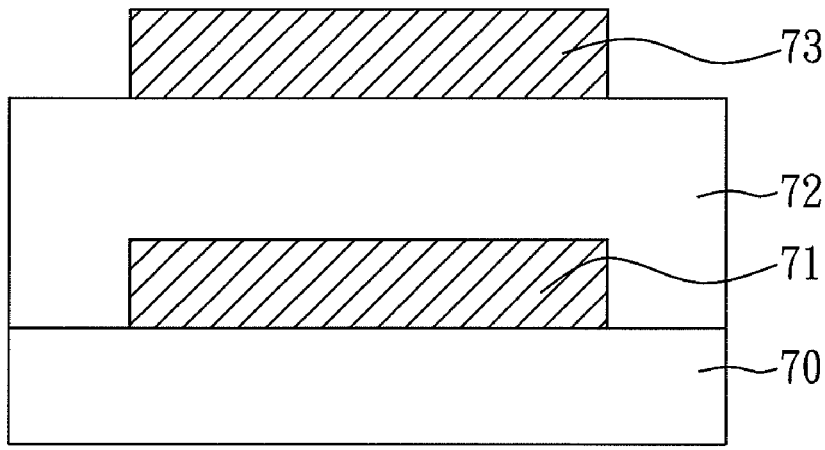

Finally, the substrate 70 was placed into a vacuum chamber (not shown in the figure) with pressure of $5 \times 10^{-6}$ ton to form a second electrode 73 with a thickness of 80 nm, as shown in FIG. 7C.

As shown in FIG. 7C, after the aforementioned process, a MIM capacitor of the present embodiment was obtained, which comprises: a substrate 70; a first electrode 71 disposed on the substrate 70; an insulating layer 72 disposed on the substrate 70 and covering the first electrode 71, wherein the insulating layer 72 comprises silk protein; and a second electrode 73 disposed on the insulating layer 72.

[Evaluation the Characteristics of the MIM Capacitor]

Figure 8:
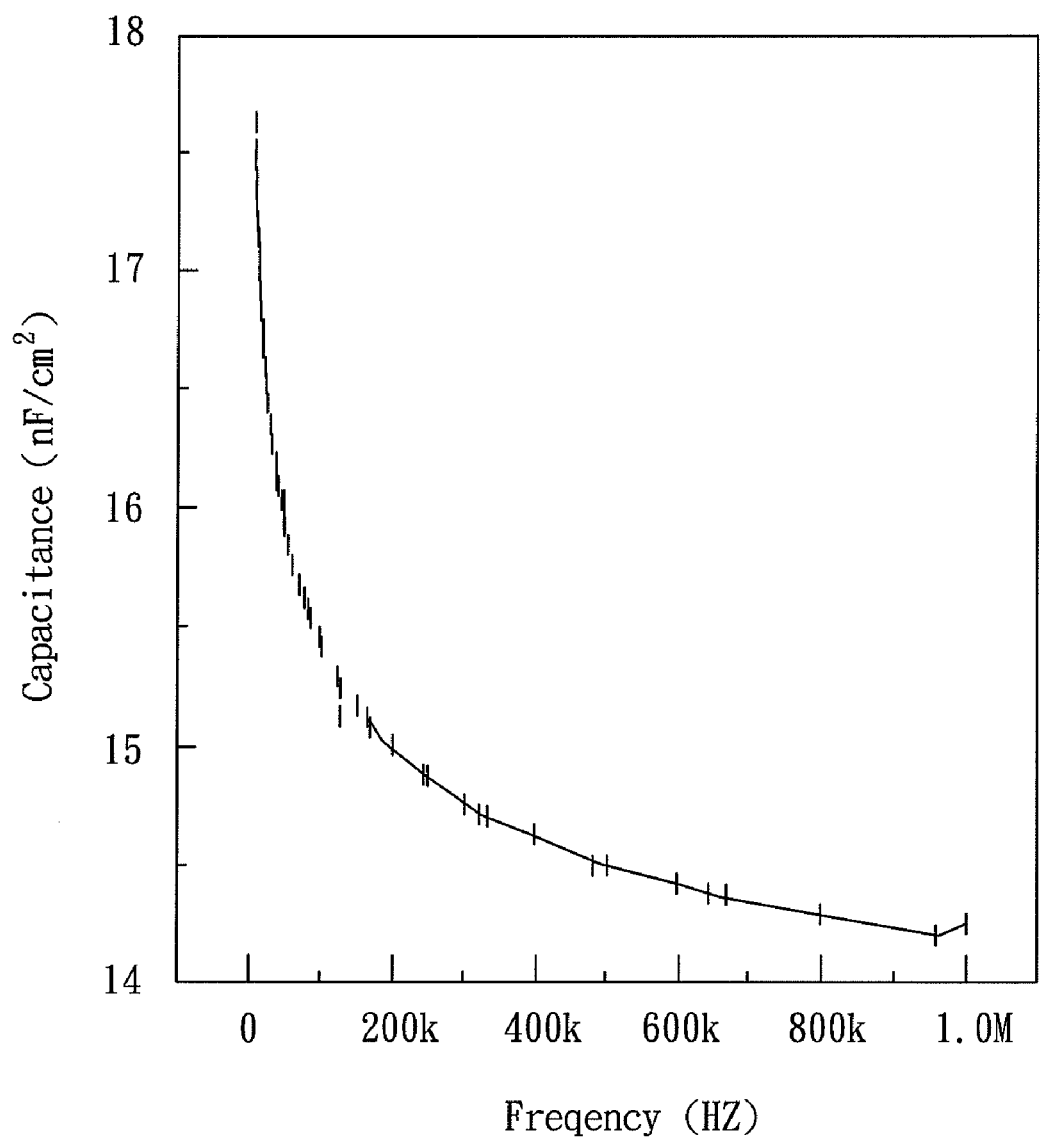
FIG. 8 is a curve showing the capacitance-frequency characteristic of the MIM capacitor of Embodiment 3 of the present invention.
Figure 9:
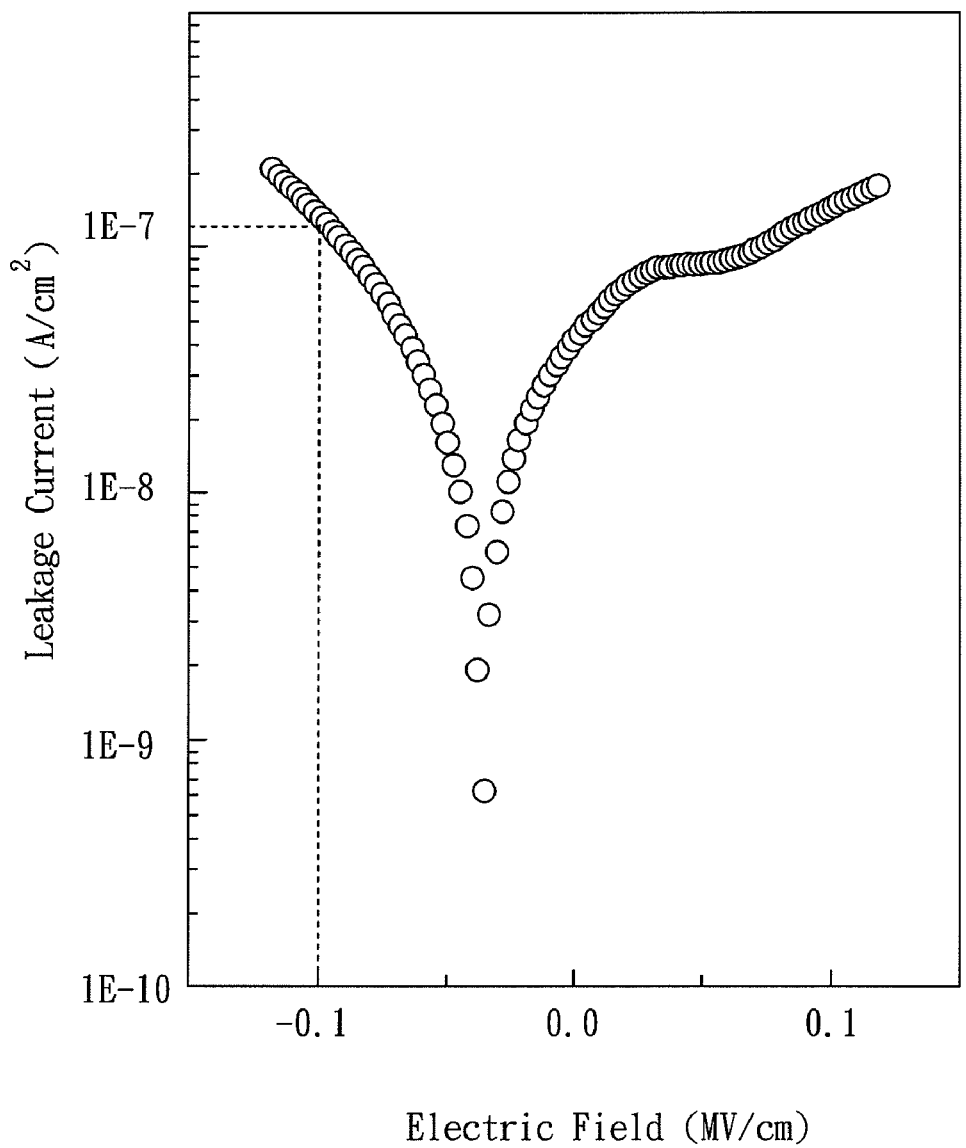
FIG. 9 is a curve showing the electric field-leakage current characteristic of the MIM capacitor of Embodiment 3 of the present invention.

The dielectric characteristic of the MIM capacitor of the present embodiment was evaluated, and the evaluation results are shown in FIG. 8 and FIG. 9, wherein FIG. 8 is a curve showing the capacitance-frequency characteristic of the MIM capacitor, and FIG. 9 is a curve showing the electric field-leakage current characteristic of the MIM capacitor. After calculation, the dielectric constant ($\in$) of the silk fibroin is about 7.2, and the leakage current of the MIM capacitor is about $10^{-7}$ A/cm$^2$ under $-0.1$ MV/cm electric field. These results indicate that the silk fibroin is a good dielectric material.

In conclusion, according to the OTFT and the MIM capacitor and the methods for manufacturing the same of the present invention, the silk fibroin is used as a dielectric material, and the gate insulating layer or the insulating layer was formed through a solution process. Hence, the complexity of the process and the production cost can be greatly decreased. Also, the process of the present invention can be used to form the OTFT and the MIM capacitor with large area. In addition, when the silk fibroin is used as the material of the gate insulating layer in the pentacene OTFT, the silk fibroin can match well with the pentacene layer. Hence, the carrier mobility of pentacene in the OTFT can be increased greatly.

Although the present invention has been explained in relation to its preferred embodiment, it is to be understood that many other possible modifications and variations can be made without departing from the scope of the invention as hereinafter claimed.

What is claimed is:

1. An organic thin film transistor, comprising:
    a substrate;
    a gate electrode disposed on the substrate;
    a gate insulating layer disposed on the substrate and covering the gate electrode, wherein the gate insulating layer comprises silk protein;
    an organic semiconductor layer; and
    a source electrode and a drain electrode,
    wherein the organic semiconductor layer, the source electrode, and the drain electrode are disposed over the gate insulating layer.

2. The organic thin film transistor as claimed in claim 1, wherein the silk protein is natural silk protein.

3. The organic thin film transistor as claimed in claim 1, wherein the silk protein is fibroin.

4. The organic thin film transistor as claimed in claim 1, wherein the gate insulating layer has a multi-layered structure.

5. The organic thin film transistor as claimed in claim 1, wherein the material of the organic semiconductor layer comprises a pentacene.

6. The organic thin film transistor as claimed in claim 1, wherein the substrate is a plastic substrate, a glass substrate, a quartz substrate, or a silicon substrate.

7. The organic thin film transistor as claimed in claim 1, wherein the substrate is a plastic substrate.

8. The organic thin film transistor as claimed in claim 1, wherein the organic semiconductor layer covers the entire surface of the gate insulating layer, and the source electrode and the drain electrode respectively locate on the organic semiconductor layer, when the organic thin film transistor is a top contact organic thin film transistor.

9. The organic thin film transistor as claimed in claim 1, wherein the source electrode and the drain electrode respectively locate on the gate insulating layer, and the organic semiconductor layer covers the gate insulating layer, the source electrode, and the drain electrode when the organic thin film transistor is a bottom contact organic thin film transistor.

10. A method for manufacturing an organic thin film transistor, comprising the following steps:
    (A) providing a substrate;
    (B) forming a gate electrode on the substrate;
    (C) coating the substrate having the gate electrode formed thereon with a silk solution to obtain a gate insulating layer on the substrate and the gate electrode; and
    (D) forming an organic semiconductor layer, a source electrode, and a drain electrode over the gate insulating layer.

11. The method as claimed in claim 10, wherein the step (C) comprises the following steps:
    (C1) providing a silk solution;
    (C2) coating the substrate having the gate electrode formed thereon with the silk solution; and
    (C3) drying the silk solution coated on the substrate and the gate electrode to obtain a gate insulating layer on the substrate and the gate electrode.

12. The method as claimed in claim 10, wherein the silk solution is an aqueous solution containing natural silk protein.

13. The method as claimed in claim 10, wherein the silk solution is an aqueous solution containing fibroin.

14. The method as claimed in claim 10, wherein the material of the organic semiconductor layer comprises a pentacene.

15. The method as claimed in claim 10, wherein the substrate is a plastic substrate, a glass substrate, a quartz substrate, or a silicon substrate.

16. The method as claimed in claim 10, wherein the substrate is a plastic substrate.

17. The method as claimed in claim 10, wherein the organic semiconductor layer covers the entire surface of the gate insulating layer, and the source electrode and the drain electrode are formed on the organic semiconductor layer to obtain a top contact organic thin film transistor, in the step (D).

18. The method as claimed in claim 10, wherein the source electrode and the drain electrode are formed on the gate insulating layer, and the organic semiconductor layer covers the source electrode, the drain electrode, and the gate insulating layer to obtain a bottom contact organic thin film transistor, in the step (D).

19. A metal-insulator-metal capacitor, comprises:
   a substrate;
   a first electrode disposed on the substrate;
   an insulating layer disposed on the substrate and covering the first electrode, wherein the insulating layer comprises silk protein; and
   a second electrode disposed on the insulating layer.

20. The metal-insulator-metal capacitor as claimed in claim 19, wherein the silk protein is natural silk protein.

21. The metal-insulator-metal capacitor as claimed in claim 19, wherein the silk protein is fibroin.

22. The metal-insulator-metal capacitor as claimed in claim 19, wherein the insulating layer has a multi-layered structure.

23. The metal-insulator-metal capacitor as claimed in claim 19, wherein the substrate is a plastic substrate, a glass substrate, a quartz substrate, or a silicon substrate.

24. The metal-insulator-metal capacitor as claimed in claim 19, wherein the substrate is a plastic substrate.

25. A method for manufacturing a metal-insulator-metal capacitor, comprising the following steps:
   (A) providing a substrate;
   (B) forming a first electrode on the substrate;
   (C) coating the substrate having the first electrode formed thereon with a silk solution to obtain an insulating layer on the substrate and the first electrode; and
   (D) forming a second electrode on the insulating layer.

26. The method as claimed in claim 25, wherein the step (C) comprises the following steps:
   (C1) providing a silk solution;
   (C2) coating the substrate having the first electrode formed thereon with the silk solution; and
   (C3) drying the silk solution coated on the substrate and the first electrode to obtain an insulating layer on the substrate and the first electrode.

27. The method as claimed in claim 25, wherein the silk solution is an aqueous solution containing natural silk protein.

28. The method as claimed in claim 25, wherein the silk solution is an aqueous solution containing fibroin.

29. The method as claimed in claim 25, wherein the substrate is a plastic substrate, a glass substrate, a quartz substrate, or a silicon substrate.

30. The method as claimed in claim 25, wherein the substrate is a plastic substrate.

* * * * *